(12) United States Patent
Nandakumar

(10) Patent No.: US 11,764,111 B2
(45) Date of Patent: Sep. 19, 2023

(54) REDUCING CROSS-WAFER VARIABILITY FOR MINIMUM WIDTH RESISTORS

(71) Applicant: Texas Instruments Incorporated, Dallas, TX (US)

(72) Inventor: Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 4 days.

(21) Appl. No.: 16/662,967

(22) Filed: Oct. 24, 2019

(65) Prior Publication Data

US 2021/0125872 A1    Apr. 29, 2021

(51) Int. Cl.
| | |
|---|---|
| *H01L 21/822* | (2006.01) |
| *H01L 21/266* | (2006.01) |
| *H01L 21/265* | (2006.01) |
| *H01L 27/01* | (2006.01) |

(52) U.S. Cl.
CPC .......... *H01L 21/822* (2013.01); *H01L 21/266* (2013.01); *H01L 21/26513* (2013.01); *H01L 27/013* (2013.01)

(58) Field of Classification Search
CPC ............. H01L 21/26513; H01L 21/266; H01L 21/822; H01L 27/013
USPC ....................................................... 257/538
See application file for complete search history.

(56) References Cited

U.S. PATENT DOCUMENTS

| | | | | |
|---|---|---|---|---|
| 4,416,049 A | * | 11/1983 | McElroy | H01L 27/11 257/380 |
| 4,949,153 A | * | 8/1990 | Hirao | H01L 27/0605 257/516 |
| 5,013,677 A | * | 5/1991 | Hozumi | H01L 29/66272 257/E21.375 |
| 5,510,642 A | * | 4/1996 | Ogawa | H01L 28/20 257/380 |
| 5,554,873 A | * | 9/1996 | Erdeljac | H01L 21/32155 257/380 |
| 6,411,386 B1 | * | 6/2002 | Nishi | G01B 11/26 356/399 |
| 6,873,938 B1 | * | 3/2005 | Paxton | G03F 7/70991 438/33 |
| 7,421,358 B2 | * | 9/2008 | Tuohy | G05B 23/0221 438/18 |
| 7,738,075 B2 | * | 6/2010 | Hiar | G03F 7/70875 355/30 |
| 7,771,905 B2 | * | 8/2010 | Sentoku | G03F 7/70641 430/22 |

(Continued)

*Primary Examiner* — Jay C Kim
(74) *Attorney, Agent, or Firm* — Yudong Kim; Frank D. Cimino

(57) ABSTRACT

Fabrication of an integrated circuit includes forming a photoresist layer over a substrate. Target regions defined on the substrate are exposed using a reticle that defines a first exposure window for a first doped structure of a first type; the first exposure window has a first plurality of openings and a first plurality of dopant blocking regions. A respective exposure dose for each of the target regions is determined by an exposure map and provides controlled variations in the size of the first plurality of openings across the plurality of target regions. Subsequent to the exposure and to developing the photoresist, a dopant is implanted into the substrate through the first plurality of openings.

20 Claims, 13 Drawing Sheets

(56) References Cited

U.S. PATENT DOCUMENTS

| | | | | |
|---|---|---|---|---|
| 7,771,906 | B2* | 8/2010 | Yoshii | G03F 7/70525 430/30 |
| 7,842,967 | B2* | 11/2010 | Ohtsuka | H01L 29/8611 257/E29.174 |
| 7,851,234 | B2* | 12/2010 | Ko | H01L 22/14 438/10 |
| 7,871,745 | B2* | 1/2011 | Chen | G03F 7/70633 430/22 |
| 7,928,515 | B2* | 4/2011 | Asano | H01L 21/84 438/383 |
| 8,134,688 | B2* | 3/2012 | Shibazaki | G03F 7/70483 355/68 |
| 8,387,458 | B2* | 3/2013 | Aida | G01P 15/0802 73/514.33 |
| 8,477,310 | B2* | 7/2013 | Kobayashi | G03F 9/7003 356/401 |
| 8,487,389 | B2* | 7/2013 | Hattori | G01P 15/0802 257/419 |
| 8,890,260 | B2* | 11/2014 | Chuang | H01L 29/7833 257/379 |
| 9,229,333 | B2* | 1/2016 | Shibazaki | G03F 9/7096 |
| 9,790,085 | B1* | 10/2017 | Bilic | H01L 24/05 |
| 9,859,100 | B2* | 1/2018 | Fujimura | G03F 1/78 |
| 9,983,486 | B2* | 5/2018 | Shibazaki | G03F 7/70725 |
| 9,991,120 | B2 | 6/2018 | Montgomery | |
| 9,997,336 | B2* | 6/2018 | Meng | H01L 22/12 |
| 10,031,413 | B2* | 7/2018 | Fujimura | G03F 1/36 |
| 10,388,717 | B2* | 8/2019 | Saito | H01L 27/0802 |
| 10,508,958 | B2* | 12/2019 | Tanaka | G01L 1/18 |
| 10,522,349 | B2* | 12/2019 | Yang | G03F 7/091 |
| 10,558,127 | B2* | 2/2020 | Shinoda | G03F 7/7055 |
| 10,685,870 | B2* | 6/2020 | Hsu | H01L 21/76813 |
| 10,741,392 | B2* | 8/2020 | Su | H01L 21/76829 |
| 10,775,708 | B2* | 9/2020 | Shibazaki | G01B 11/14 |
| 10,777,441 | B2* | 9/2020 | Ichinose | H01L 21/68 |
| 10,790,195 | B2* | 9/2020 | Chang | H01L 29/66795 |
| 11,009,417 | B2* | 5/2021 | Yoneda | G01L 9/0054 |
| 2007/0096183 | A1* | 5/2007 | Ogawa | H01L 28/20 257/300 |
| 2007/0215966 | A1* | 9/2007 | Ikegami | G01P 15/123 257/419 |
| 2009/0090977 | A1* | 4/2009 | Freeman | H01L 27/0629 257/379 |
| 2020/0185521 | A1* | 6/2020 | Zhang | H01L 29/0696 |

* cited by examiner

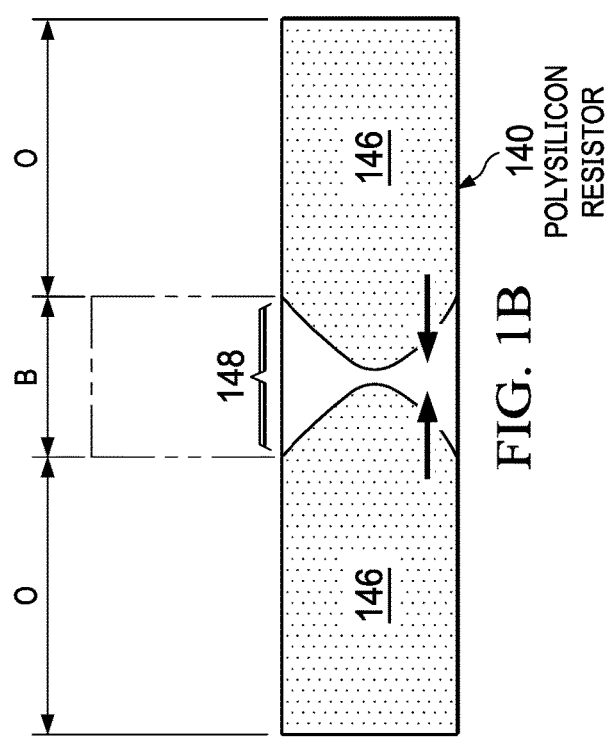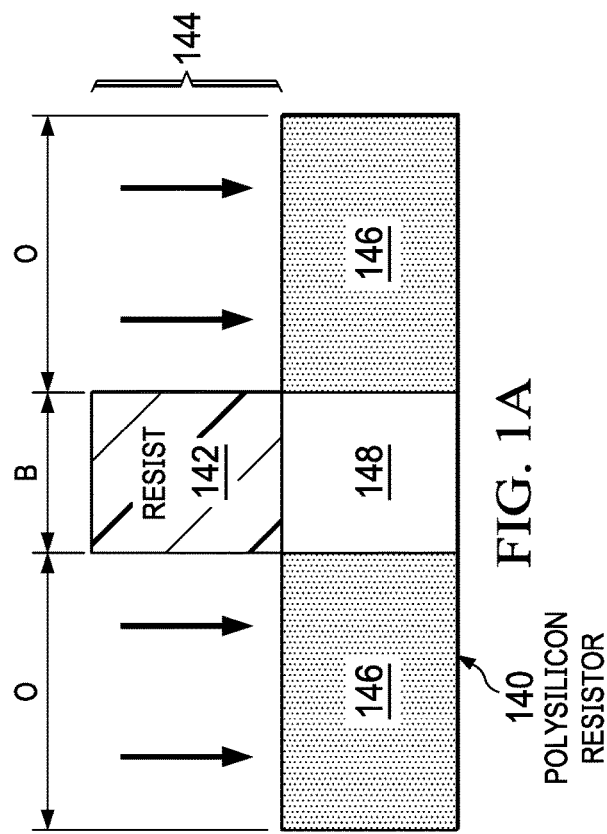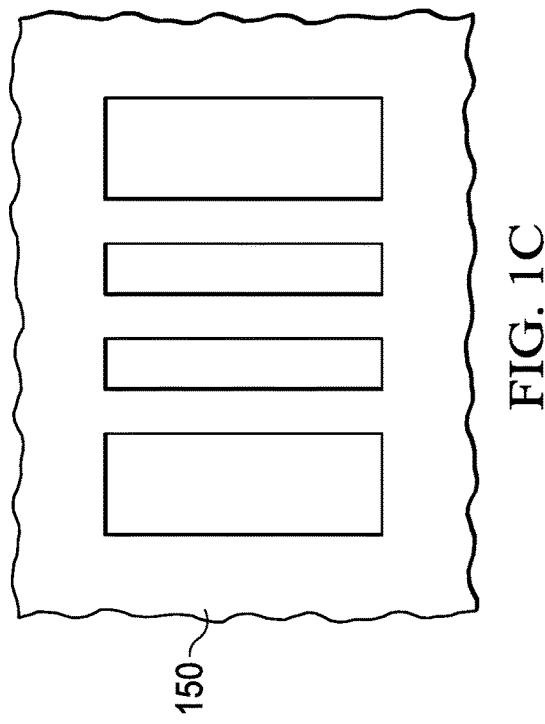

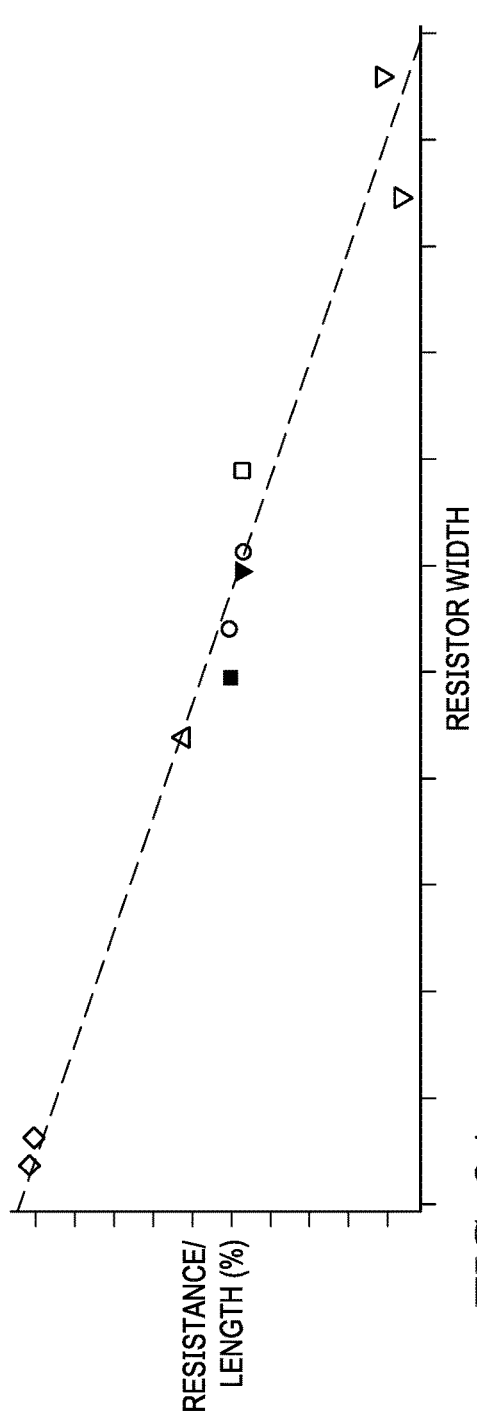
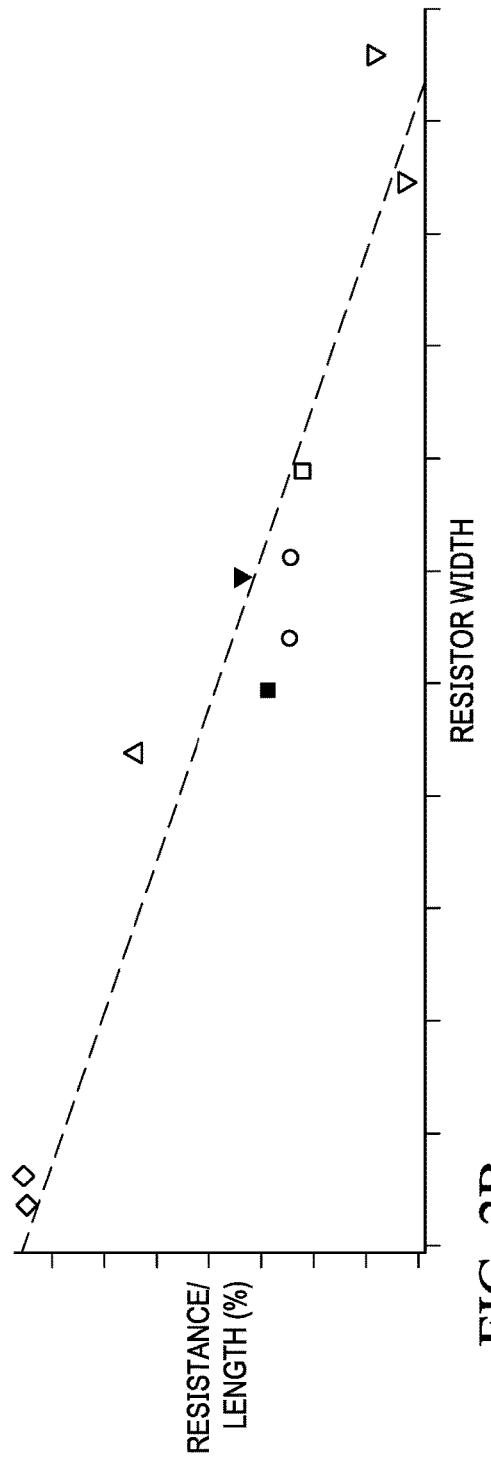
FIG. 2A
FIG. 2B

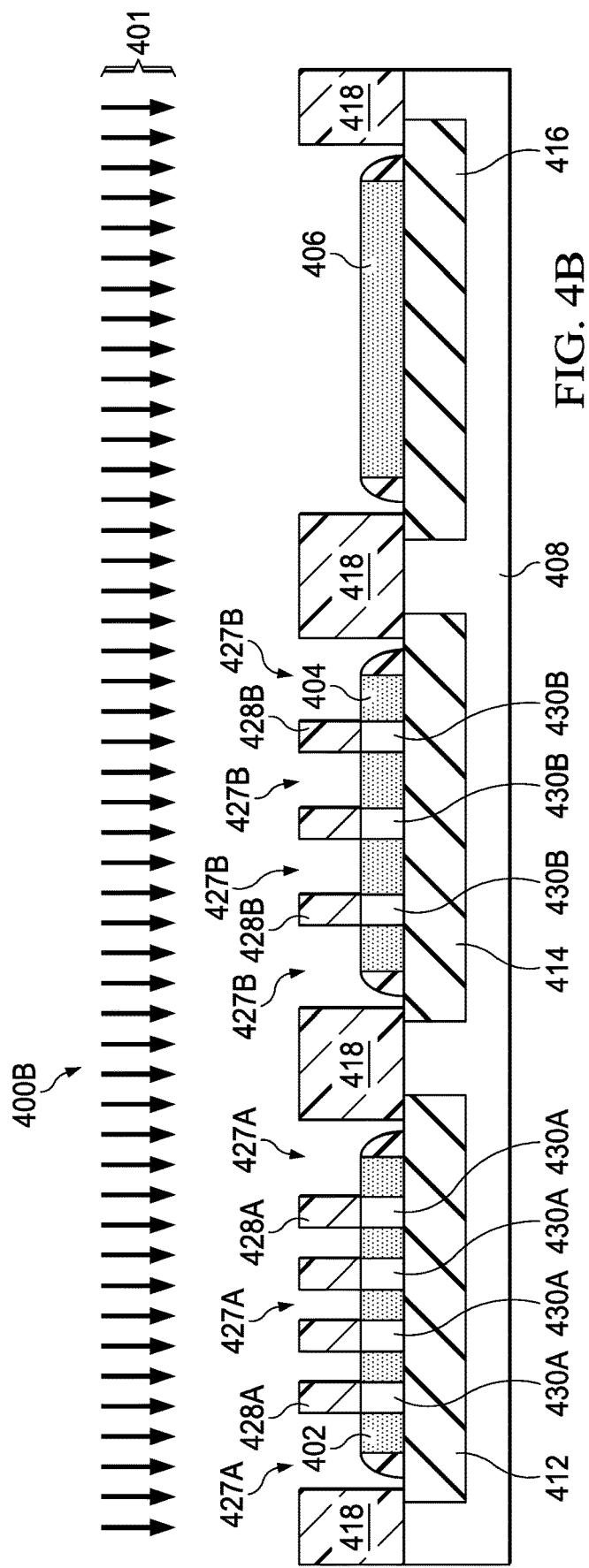
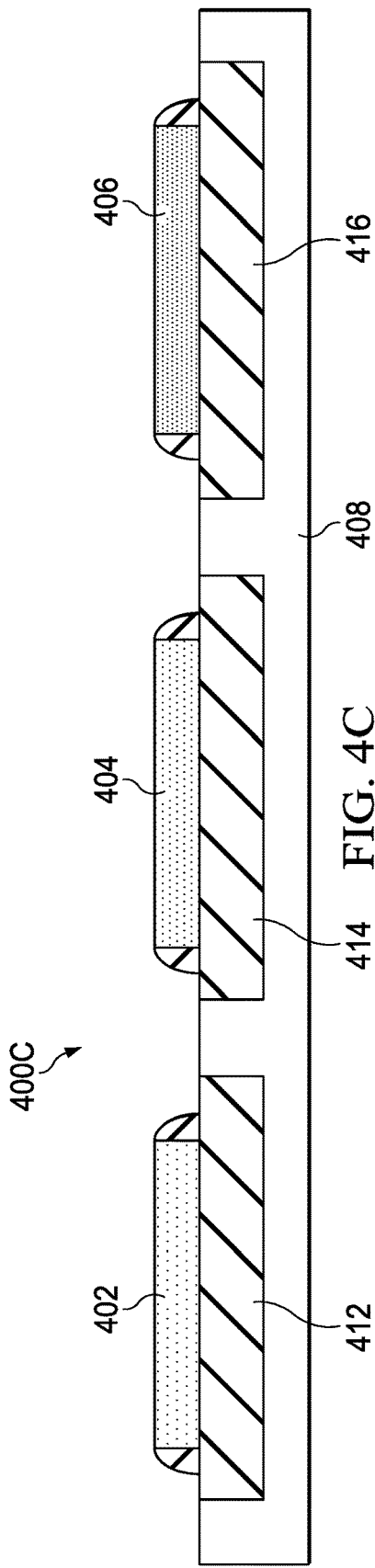
FIG. 4B
FIG. 4C

530 — IMPLANT A PRE-AMORPHIZATION IMPLANT THROUGH THE FIRST PLURALITY OF OPENINGS

FIG. 5A

535 — DEFINE THE EXPOSURE MAP USING MEASUREMENTS TAKEN ON A COMPLETED WAFER

FIG. 5B

540 — DEFINE THE EXPOSURE MAP USING MEASUREMENTS TAKEN ON A WAFER IN FABRICATION

FIG. 5C

545 — THE RETICLE FURTHER DEFINES A SECOND EXPOSURE WINDOW FOR A SECOND DOPED STRUCTURE HAVING THE FIRST TYPE. THE SECOND EXPOSURE WINDOW HAS A SECOND PLURALITY OF OPENINGS AND A SECOND PLURALITY OF DOPANT BLOCKING REGIONS THAT HAVE A DIFFERENT ARRANGEMENT FROM THE FIRST PLURALITY OF OPENINGS AND FIRST PLURALITY OF DOPANT BLOCKING REGIONS

FIG. 5D

550 — THE RETICLE FURTHER DEFINES A THIRD EXPOSURE WINDOW FOR A THIRD DOPED STRUCTURE HAVING THE FIRST TYPE. THE THIRD EXPOSURE WINDOW HAS A SINGLE OPENING

FIG. 5E

REDUCING CROSS-WAFER VARIABILITY FOR MINIMUM WIDTH RESISTORS

BACKGROUND

The processes used to create complementary metal oxide silicon (CMOS) resistors, e.g., polysilicon deposition and patterning, implantation, and high temperature anneal, can produce significant variations in resistance across the wafer. Minimum width resistors can have greater variability in resistance, because small variations in polysilicon linewidth have a larger effect on the resistance. When the variations become too great, some resistors will need to be trimmed at test, which increases test costs.

SUMMARY

Disclosed embodiments provide a method of fabricating a resistor that combines dilution doping of resistors or other doped structures with the use of an exposure map that defines the photoresist exposure dose and/or exposure time for each of a set of target regions defined across the wafer. The target regions may be the "shots" that a stepper or scanner takes when exposing a photoresist layer for patterning or the target regions may be smaller sections of the wafer when a dose mapper process is used. The combination of dilution doping with variable exposure doses and/or times can be used to compensate for variations in structures and processes across the wafer that cause large variability in the doped structures and their resulting properties.

In one aspect, an embodiment of a method of fabricating an integrated circuit is disclosed. The method includes forming a photoresist layer over a substrate; for each of a plurality of target regions defined on the substrate, exposing a respective target region using a reticle that defines a first exposure window for a first doped structure having a first type, the first exposure window having a first plurality of openings and a first plurality of dopant blocking regions, a respective exposure dose for each of the plurality of target regions being determined using an exposure map, thereby providing controlled variations in a size of the first plurality of openings across the plurality of target regions; and subsequent to the exposure and to developing the photoresist, implanting a dopant into the substrate through the first plurality of openings.

In another aspect, an embodiment of a method of fabricating an integrated circuit is disclosed. The method includes forming a layer of photoresist over a substrate; for each of a plurality of target regions defined on the substrate, exposing a respective target region using a reticle that defines a first exposure window for a first resistor, the first exposure window having a first plurality of openings and a first plurality of dopant blocking regions, each of the plurality of target regions receiving a respective exposure dose defined in an exposure map, thereby providing controlled variations in a size of the first plurality of openings across the plurality of target regions.

In yet another aspect, an embodiment of an integrated circuit (IC) chip is disclosed. The integrated circuit includes a first resistor formed on a first level of the IC chip and comprising a first dopant at a first concentration; and a second resistor formed on the first level and comprising the first dopant at a second greater concentration.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 1A and 1B illustrate implant straggle and grain boundary diffusion in a doped structure during an anneal;

FIG. 1C depicts a portion of a reticle containing an exposure window for a resistor according to an embodiment of the disclosure;

FIGS. 2A and 2B depict graphically how the resistance/length of dilution doped resistors tracks critical dimensions as measured by scatterometry for two different widths of resistors;

FIGS. 4A-4C depict stages during the fabrication of three polysilicon resistors according to an embodiment of the disclosure;

FIGS. 5A-5E depict additional elements that may be part of the method of FIG. 5;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

For the purposes of the present application, the following definitions are provided. A doped structure is any feature or structure within or on the substrate of a semiconductor wafer that receives an implanted dose of one or more dopants using a patterned layer of photoresist. The type of doped structure is determined by the end use of the doped region, e.g., a resistor, a source, a drain, an extended source/drain region, a gate, etc. A reticle is a tool that contains a pattern image that needs to be stepped and repeated in order to expose an entire wafer or mask. The patterns on a reticle are typically two to twenty times the size of the patterns on the substrate.

Resistors that are used in integrated circuits to set voltage levels and to determine signal delays are typically formed during the manufacture of integrated circuits. These resistors can be formed using wells, diffusions within wells, or using doped polysilicon. Doped polysilicon resistors are preferred because unlike well resistors and diffusion resistors, which have significant diode capacitance, the doped polysilicon resistors may be formed on thick isolation structures and have very low capacitance to the silicon substrate.

To reduce costs, resistors are usually formed using masking and implantation steps that are already in the integrated circuit manufacturing flow. For example an N-well resistor may be formed using the patterning and implantation steps that are also used to form N-type wells in which P-type metal oxide silicon (PMOS) transistors will be formed. A diffused N-type resistor may be formed using the patterning and implantation steps that are also used to form the N-type source and drain for N-type metal oxide silicon (NMOS) transistors. A polysilicon resistor may be formed at the same time as the polysilicon transistor gates and may use either the polysilicon gate doping or the source and drain doping. By using existing patterning steps and implantation steps, additional cost to form resistors may be avoided.

Figure 7A:
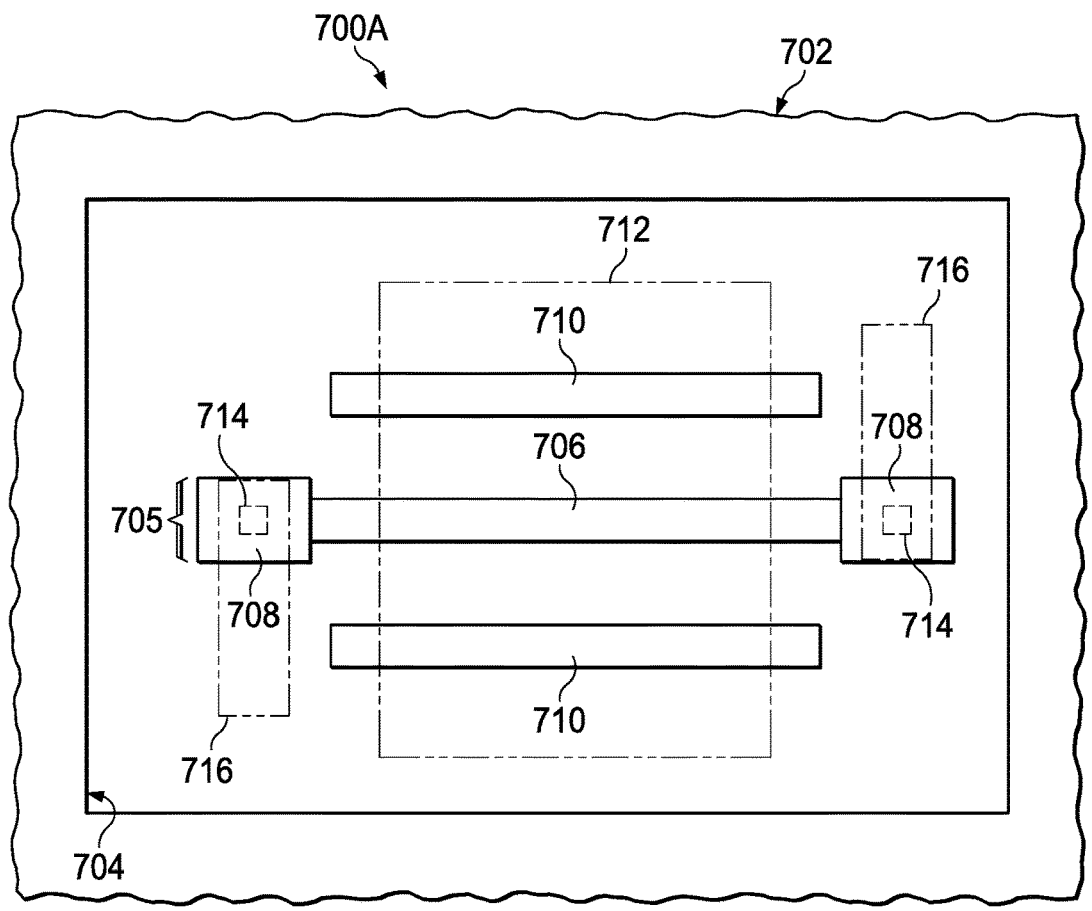
FIG. 7A depicts an opening in a photoresist layer for a resistor according to the prior art.
Figure 7B:
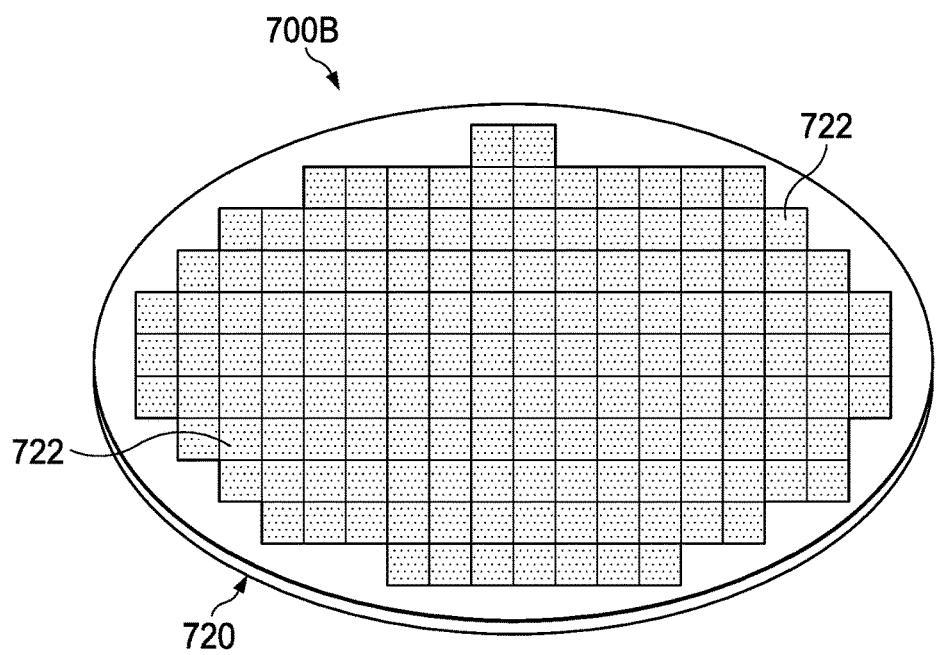
FIG. 7B graphically depicts a uniform exposure map typically used for creating resistors according to the prior art.

FIGS. 7A and 7B depict two different aspects of the fabrication process that affect the resistance of a polysilicon resistor formed on an integrated circuit chip, i.e., the exposure window for implanting dopants into the resistor and the exposure dosage used in creating the window. FIG. 7A depicts an enlarged portion of a semiconductor wafer 700A during fabrication of a polysilicon resistor 705 according to the prior art. Semiconductor wafer 700A is covered by a photoresist layer 702 into which an exposure window 704 has been etched. Seen through exposure window 704 is polysilicon resistor 705, which includes a body 706 and heads 708, and two dummy lines 710 that are used to help control the width of the polysilicon resistor 705. Several elements of the resistor 705 that will be formed at a later time are shown in dotted outline in this figure. The elements shown as dotted lines are a silicide blocking region 712, which is used to ensure that the resistance of the polysilicon resistor 705 is due to the doping of the polysilicon rather than to the presence of a silicide, contact regions 714 and metallization layers 716. The exposure window 704 in photoresist layer 702 thus exposes the entire resistor during implantation of a dopant.

FIG. 7B graphically depicts an exposure map 700B for a semiconductor wafer 720 on which are defined a number of regions 722. Each region 722 defines a size that can be patterned using a reticle to define various features and doped structures; regions 722 define the number of shots a stepper will make in patterning each wafer. The even texture shown in the regions 722 across wafer 720 represents the fact that the exposure and the dose of dopants implanted into each resistor is designed to be the same across the entire wafer.

Advanced CMOS flows typically have a boron implanted polysilicon resistor with an implant dose that is adjusted for zero temperature coefficient (tempco) of resistance (ZTCR) using an implant dosage in the range of $1\times10^{15}$ to $1\times10^{16}$ ions/cm$^2$. The implanted dopants are activated by high temperature anneal, e.g. 900-1100° C. Changes in anneal temperature across the wafer can lead to different levels of dopant activation and diffusion resulting in resistance non-uniformity. Inherent process variations in the polysilicon deposition tool and/or process can cause small changes in the range of about 5-10% in polysilicon thickness and grain morphology, which in turn can lead to resistor variability. The combination of these factors can combine to produce significant variation in resistance across the wafer.

The resistance (Rresistor) in a polysilicon resistor is determined by the formula $$R\text{resistor} = R\text{sheet} \cdot (\text{length/width}) \qquad \text{Equation 1}$$

Where Rresistor is the resistance for the resistor, Rsheet is the sheet resistance, and length and width refer to the dimensions of the resistor. Higher resistance can be achieved by increasing the sheet resistance or the length of the resistor or by decreasing the width of the resistor. Lengthening the resistor requires more space on the chip, which drives up cost, so decreasing the width of the resistor is preferable, although this can also increase the variability across the wafer. Increasing the sheet resistance can be accomplished by reducing the doping level of the resistor, but this can change the temperature coefficient of the resistor and also cause greater variability. Another method of increasing the sheet resistance is by counter-doping, e.g., by implanting an N-type dopant such as arsenic or phosphorus into a resistor doped with a P-type dopant such as boron. However, counter-doping also changes the temperature coefficient while causing significant increase in resistor variability. To keep the variability at reasonable levels, the increase in resistance by this approach is limited to a factor of 2-3×.

Figure 8:
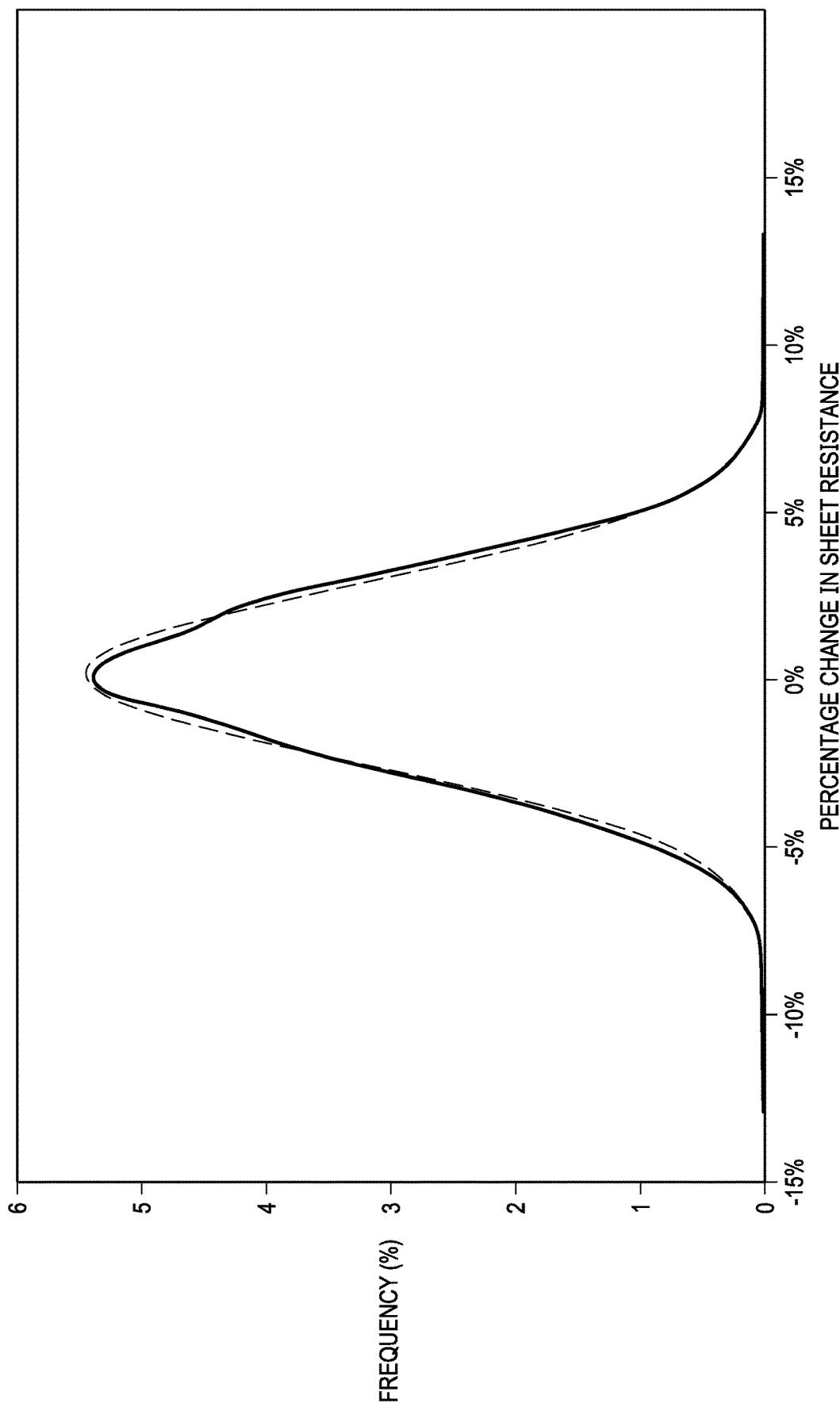
FIG. 8 depicts a histogram plot of sheet resistance for fifty lots of zero temperature coefficient resistors.

FIG. 8 depicts two curves relating to the relative frequency of different levels of sheet resistance. The solid line is a smooth curve of the sheet resistance obtained in fifty lots of 25 wafers per lot of a resistor doped at ZTCR levels, with the relative frequency plotted against sheet resistance. The dotted line depicts the normal curve. The three-sigma variation of the sheet resistance is +/−8%. The control limits of the resistor are set at +/−15% to achieve a manufacturing process capability index (Cpk) of greater than 1.5.

Additionally, as the width of the resistor is decreased in order to increase the resistance, the variability increases. In a series of tests fabricating resistors having widths of about 0.16 μm with varying doping levels and anneal processes, the variability at three sigma was twenty-eight percent (28%). This level of variability needs to be reduced in order for the production of circuits containing these resistors to be cost effective.

Figure 1:
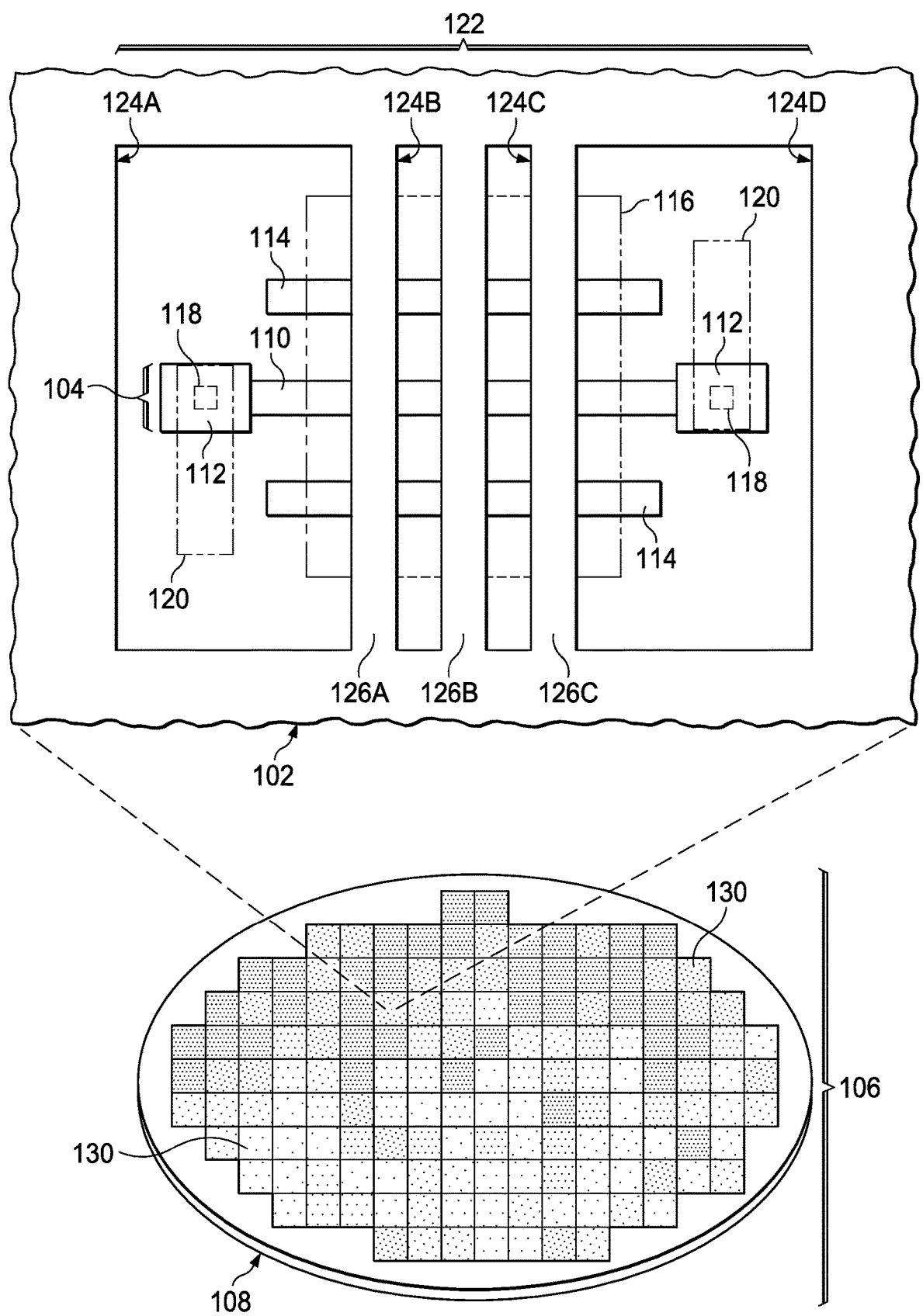
FIG. 1 illustrates the elements of a methodology that may reduce the variations in doping across a semiconductor wafer, including a patterned photoresist that can be used in the formation of a dilution doped polysilicon resistor and a graphical representation of an exposure map used to vary the size of opening created by the pattern according to an embodiment of the disclosure.

FIG. 1 graphically depicts a methodology for fabricating doped structures, such as resistors, on a semiconductor wafer in which the uniformity of the resistance across the wafer may be improved. The methodology includes using a reticle that can form a patterned photoresist layer 102 for use in implanting dopants for a resistor 104 and an exposure map 106 for a semiconductor wafer 108, where the exposure map 106 is used in creating a patterned photoresist in which the exposure windows have openings that vary in width across the semiconductor wafer 108 in order to adjust the resistance of the resistors formed thereby. As will be discussed in further detail below, the methodology can also include a pre-amorphization implant (PAI) that is performed prior to implanting the dopant to improve diffusion of the dopant. Resistor 104 again includes a body 110 and heads 112 and lies between dummy lines 114. The regions where a silicide blocking region 116, contact regions 118 and metallization 120 will be formed are again shown by dotted lines. Instead of patterned photoresist 102 containing a single exposure window that exposes all of resistor 104, the exposure window 122 for resistor 104 includes a series of openings 124A, 124B, 124C, 124D that are separated by dopant blocking regions 126A, 126B, 126C.

Partial blocking of implanted dopants as accomplished by patterned photoresist 102 is termed "dilution doping" and is described in U.S. Pat. No. 9,991,120 to Scott K. Montgomery et al., which issued on Jun. 5, 2018 and which is hereby incorporated by reference in its entirety. Dilution doping can accomplish a lower dopant level, which can be useful when, for example, the desired dopant level of a resistor is less than the dopant level for a gate polysilicon that is implanted at the same time. The effect is illustrated in FIGS. 1A and 1B, which depict implant straggle and grain boundary diffusion in a polysilicon resistor 140. In FIG. 1A, resist 142 is a dopant blocking region; when dopant 144 is implanted, exposed regions 146 within the openings receive the dopants 144, while region 148, which is covered by resist 142, receives no dopant. FIG. 1B depicts the same polysilicon resistor 140 during an anneal process after the resist 142 has been removed. As the polysilicon resistor 140 is annealed, the dopants in exposed regions 146 will spread into the region formerly covered by resist layer 142, primarily following the grain boundaries. Depending on the parameters of the annealing process, the resulting doping levels across polysilicon resistor 140 may be uniform or non-uniform.

The disclosed implementation combines a dilution doping reticle that can form a patterned photoresist layer, e.g. patterned photoresist layer 102, with an exposure map 106 that identifies different exposure times for each of a number of target regions 130. In one embodiment, the target regions 130 are the shots defined for the stepper, with each shot having a respective exposure time defined. In one embodiment, a dose mapper (DOMA) process is utilized in which the target regions may be smaller sections within the wafer die, allowing for exposure control both within die and across the wafer thereby providing even greater granularity for the exposure time. FIG. 1C depicts a portion of a reticle 150 that can be utilized to pattern the resistor 104. Reticle 150 will produce a patterned photoresist that is a copy of the pattern made by the reticle. In another embodiment, the reticle can be an inverse of reticle 150, with openings and covered regions reversed to pattern a negative photoresist.

When the exposure dose associated with a dilution doping reticle such as reticle 150 is changed, the width of the openings 124 and dopant blocking regions 126 created in the photoresist are also changed. When the exposure dose is increased, the width of openings 124 formed in the patterned photoresist 102 are increased and the resultant width of the dopant blocking regions 126 are decreased. Larger openings 124 will then receive a larger dose of dopant and decrease resistance, while smaller openings will receive a smaller dose of dopant and increase resistance. By carefully designing the widths provided by the dilution doping reticle 150 and correlating the exposure map 106 with differences in resistance that are created by the prior art methods, the variations in resistance across the wafer can be reduced.

As mentioned previously, a pre-amorphization implant can enhance diffusion of the dopant and make the dopant dispersion more uniform. The PAI transforms the surface of the silicon substrate into a more amorphous state, which suppresses the channeling phenomenon at the time of dopant implantation and creates silicon interstitials which lead to enhanced dopant diffusion during anneal and more uniform dopant distribution across the resistor or other doped structure. The PAI further provides a mechanism for controlling the temperature coefficient. When the concentration of the dopant is lowered during diffusion, the temperature coefficient tends to become more negative. Use of the PAI may provide recovery of the loss of temperature coefficient, which in one embodiment is ZTCR. The use of PAI in conjunction with dilution doping and exposure mapping thus enhances control of the disclosed process.

Using the disclosed process in 248 nm processing, implant lines and spaces as small as 0.19 um can be provided. This can be further reduced to 70 nm implant lines and spaces by using 190 nm attenuated phase shift masks. Variations in spacing of up to plus or minus ten percent can be implemented across the wafer using either by-shot exposure or a dose mapper process to control uniformity. The disclosed methodology can be implemented using dedicated implant, mask or a standard drain extension or source-drain implant/mask available in the CMOS flow. In either case, the design rules for the implant layer/mask must accommodate the exposure variability of about 20-30 nm needed to control the resistors.

The exposure map 106 can be created using methodologies that can either determine resistance in the finished doped structure or else measure a feature that affects the resistance, e.g., variations in the height or width of polysilicon lines that are to be doped. An end-of-line resistance map can be created initially using test wafers, with periodic updates to the resistance map as lots are fabricated. The resistance map can then be fed to a program that translates the differences in resistance into an exposure map such as exposure map 106. Although exposure map 106 is shown graphically in these figures, the actual exposure map 106 can be provided as any type of file that can be interpreted by a stepper that exposes the reticle.

One method that can be utilized during the fabrication of a wafer is the use of scatterometry to measure the critical dimensions (width, sidewall angle and thickness) of polysilicon lines that are used to create gates and polysilicon resistors. FIGS. 2A and 2B are graphs that plot the resistance per length of a set of resistors versus variations in width of the polysilicon lines. FIG. 2A includes data on resistors whose drawn width is 0.07 microns (70 nm) and whose actual width is determined by scatterometry; FIG. 2B includes data on resistors whose drawn width is 0.16 microns. In both graphs, it is clear that the variability in resistance correlates with the variability in width as determined by scatterometry. Scatterometry can thus be utilized during fabrication to allow adjustment to the doping levels that resistors are to receive. The adjustments can be translated into corresponding exposure times for each target region across the wafer to update an exposure map.

In addition to the use of the disclosed methodology to improve the variability of resistance across the wafer, the size of the openings created in the exposure window can be varied between different resistors that are created using the same masking operation in order to provide resistors having deliberately different resistances with the same footprint.

Support for this capability was tested using a number of different structures, each of which was tested using from 75-300 individual embodiments in each of three different widths: 0.07 μm, 0.16 μs, and 1.5 μm. Table 1 below provides a summary of the results:

TABLE 1

| Dopant Implant mask | | Resistor | | Resistor | | Resistor | |
|---|---|---|---|---|---|---|---|
| Blocking | | W = 0.07 um | | W = 0.19 um | | W = 1.5 um | |
| region (%) | Opening (%) | Median (ohms/um) | Sigma (%) | Median (ohms/um) | Sigma (%) | Median (ohms/um) | Sigma (%) |
| 40 | 60 | 9.00E+04 | 9.5 | 1.50E+04 | 4.1 | 8.70E+02 | 2.7 |
| 20 | 80 | 5.00E+04 | 8.7 | 9.00E+03 | 3.8 | 5.70E+02 | 2.4 |
| 0 | 100 | 1.15E+04 | 8.5 | 3.73E+03 | 3.6 | 2.76E+02 | 2.3 |

As shown in Table 1, a first set of resistors was formed using a dopant implant mask that blocked forty percent (40%) of the resistor area, a second set of resistors was formed using a dopant implant mask that blocked twenty percent (20%) of the resistor area, and a third set of resistors had no blocking in the dopant implant mask. The median resistance and the sigma for each set of resistors are shown. By using a partial exposure of sixty percent (60%), the resistance for a given footprint is increased by three to nine times depending on the width of the resistor. By changing the exposure window from sixty to eighty percent (60-80%), plus or minus 10% across the wafer or die, a resistance variation of plus or minus ten to fifteen percent (10-15%), can be compensated.

When resistors created using the disclosed variable openings are compared to a resistor created using a single opening as in the prior art, the resistors having the narrowest width, i.e., 0.07 μm, exhibited a resistance of four to eight times higher for the same footprint, while the wider resistors exhibited a resistance of two to four times higher resistance for the same footprint with no increase in variability. The data thus supports the concept of controlling resistance using variations in stripe width. Patterns other than stripes, e.g., a checkerboard pattern, can be expected to provide similar results.

Figure 3A:
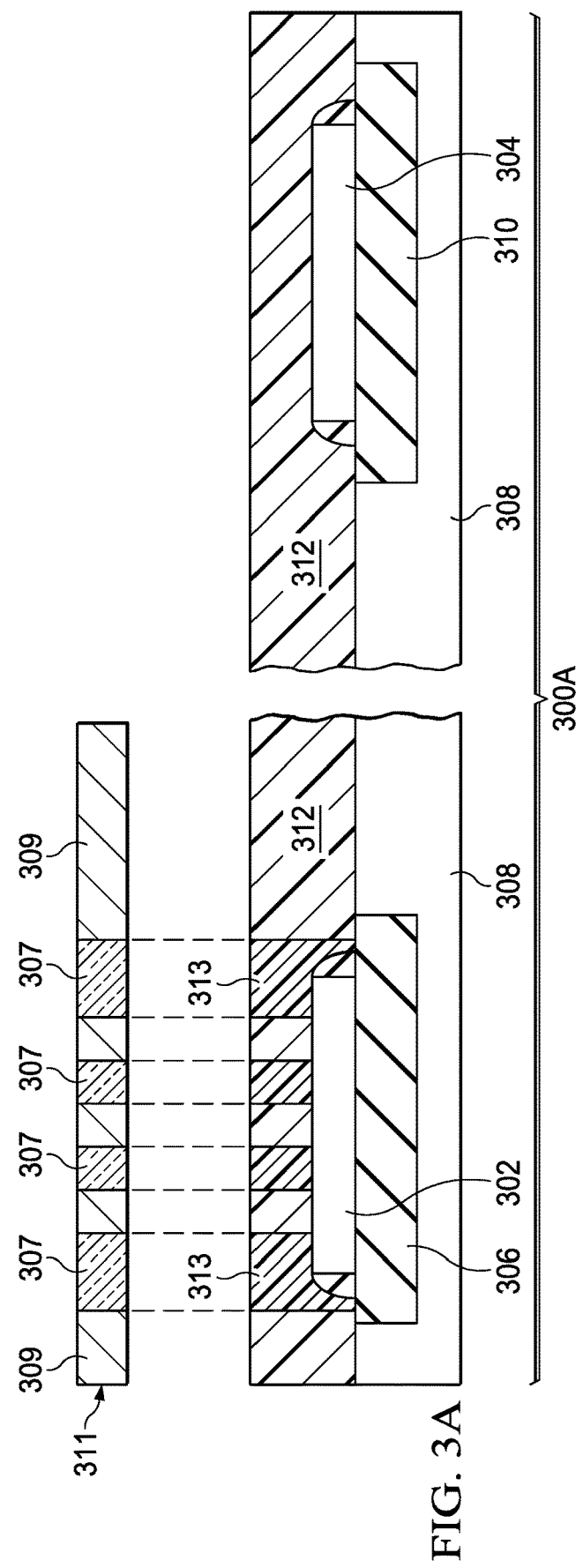
FIGS. 3A-3E depict stages during the fabrication of two versions of a polysilicon resistor fabricated in different regions of a wafer according to an embodiment of the disclosure.

FIGS. 3A-3E and 4A-4C are provided in order to illustrate the different ways in which the disclosed methods can be utilized. In FIG. 3A, wafer 300A includes polysilicon resistor 302 and polysilicon resistor 304 that have been fabricated except for receiving appropriate dopants to set their resistance. Although polysilicon resistors are used as examples in these drawings, the same methodology can be used for other doped structures, e.g., gates, source/drain regions, extended source/drain regions, resistors formed in the substrate, etc. Polysilicon resistor 302 and polysilicon resistor 304 are two versions of a single resistor, e.g., on different chips, and are designed to have the same resistance. However, due to factors such as variations in the depth of polysilicon, variations in linewidth, amount of dopants received, etc., the variability between polysilicon resistor 302 and polysilicon resistor 304 may be greater than can be tolerated in the fabrication of the wafer. Polysilicon resistor 302 can be located, for example, near the edge of the wafer while polysilicon resistor 304 can be located near the center of the wafer. In other embodiments, the positions of polysilicon resistor 302 and polysilicon resistor 304 can be reversed, both resistors can be located near the center of the wafer, polysilicon resistor 302 can be located on the opposite side of the wafer from polysilicon resistor 304, or any other variation in position.

Polysilicon resistor 302 has been formed over a thick isolation structure 306 formed in substrate 308 and polysilicon resistor 304 has been formed over a thick isolation structure 310 in substrate 308. In one embodiment, both isolation structure 306 and isolation structure 310 may be shallow trench isolation structures. A photoresist layer 312 has been formed over substrate 308 and patterned in preparation for implanting dopants into both polysilicon resistor 302 and polysilicon resistor 304 and the gates (not specifically shown) for transistors formed on the wafer.

In this example, it has been determined that in order to provide less variability in resistance across the wafer, the resistance of polysilicon resistor 302 needs to be increased with respect to polysilicon resistor 304. This determination may be the result of an end-of-line cross wafer sheet resistance map created after the previous lot of wafers was completed. The determination may also be the result of measurements made on the polysilicon lines that indicate that polysilicon resistor 302 is wider than polysilicon resistor 304 and thus may need a lesser dose of dopant.

As seen in FIG. 3A, a photoresist layer 312 has been deposited over wafer 300A. Additionally, a reticle 311 has been positioned over a first region that contains polysilicon resistor 302. Reticle 311 contains transparent regions 307 that allow light to pass through and light blocking regions 309 that block light. Using an exposure map, a first exposure dose is used to expose the first region and results in exposed sections 313 of photoresist layer 312. In this example, the first exposure dose results in exposed sections 313 that align with the edges of the transparent regions 307. At the time that reticle 311 is positioned over the first region containing polysilicon resistor 302, polysilicon resistor 304 does not receive any exposure.

Figure 3B:
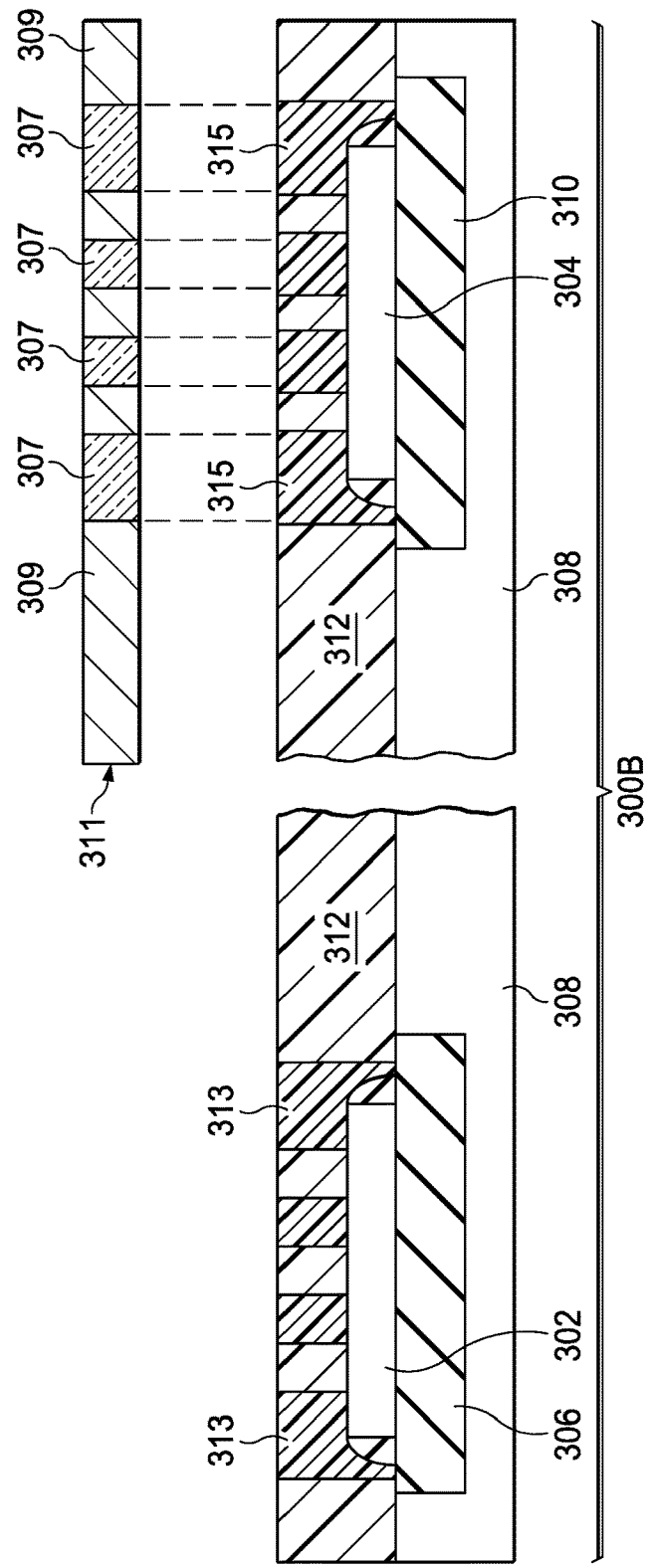

As seen in FIG. 3B, subsequent to exposing the first region, the same reticle 311 is now positioned over a second region of wafer 300B that contains polysilicon resistor 304 and a second exposure dose is used to expose the second region. This second exposure dose is greater than the first exposure dose used for polysilicon resistor 302. As a result, the exposed regions 315 of photoresist layer 312 are slightly wider than the respective transparent regions 307 of reticle 311.

Figure 3C:
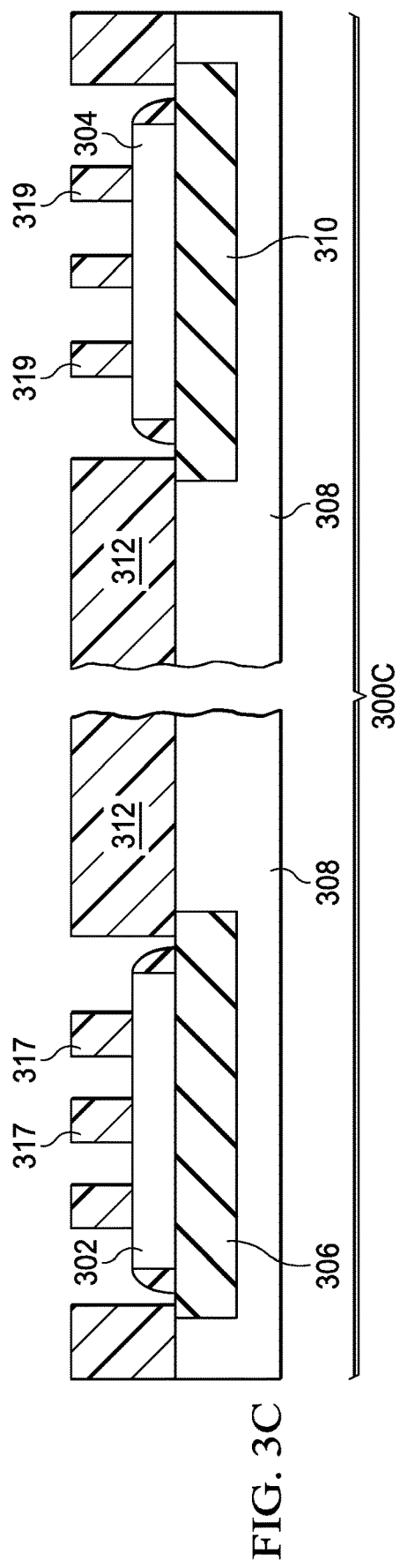

FIG. 3C depicts wafer 300C once the photoresist 312 has been developed. Because the exposure dose received by the shot of which polysilicon resistor 302 is a part was less than the exposure dose received by the shot of which polysilicon resistor 304 is a part, the dopant blocking regions over polysilicon resistor 302 are somewhat larger than the dopant blocking regions over polysilicon resistor 304 and the openings over polysilicon resistor 302 are somewhat smaller than the openings over polysilicon resistor 304.

Figure 3D:
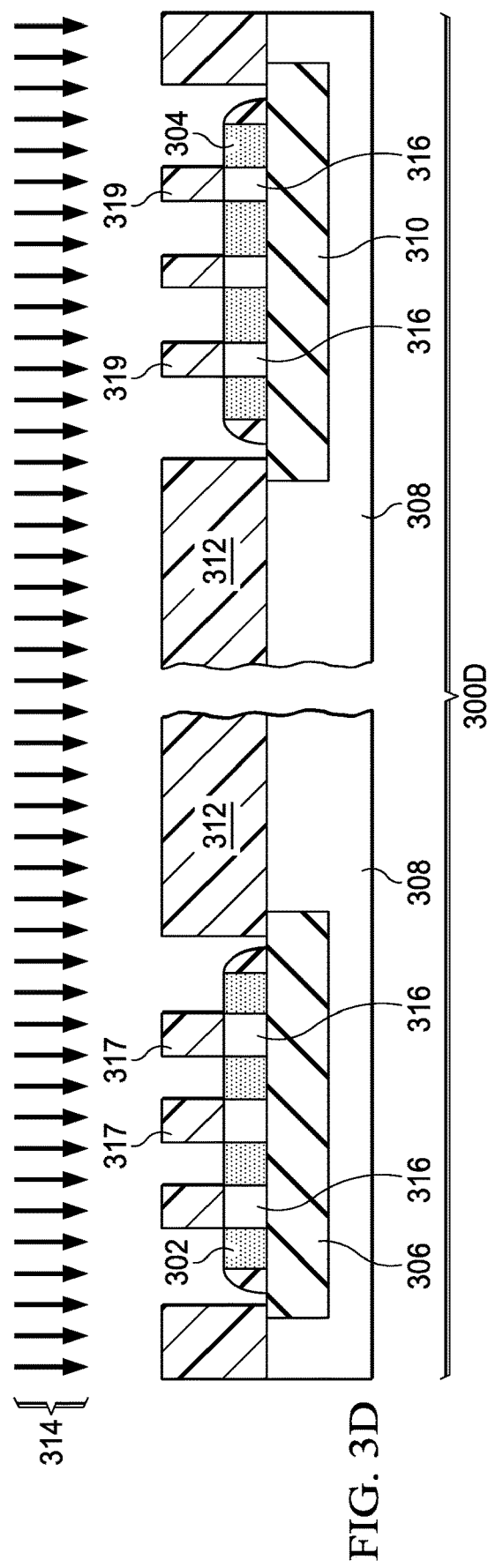

FIG. 3D depicts wafer 300D, which includes polysilicon resistor 302 and polysilicon resistor 304 during the implanting of dopants 314. Dopants 314 may be boron or any other dopant used to adjust the resistance of the polysilicon resistors. In one embodiment, the dosage of dopants is calculated to provide zero temperature coefficient resistance. In one embodiment, prior to implanting boron or other dopants, a pre-amorphization implant is performed using the same photoresist layer 312. The pre-amorphization implant, which can be germanium, silicon or other PAI implant, enables more uniform dopant distribution and also helps to maintain the temperature coefficient. Given the adjustments made to the exposure map for the two resistors, polysilicon resistor 304 will receive a slightly larger overall dose of dopant than polysilicon resistor 302 due to the larger exposed area of polysilicon resistor 304 and the smaller un-doped regions 316.

Figure 3E:
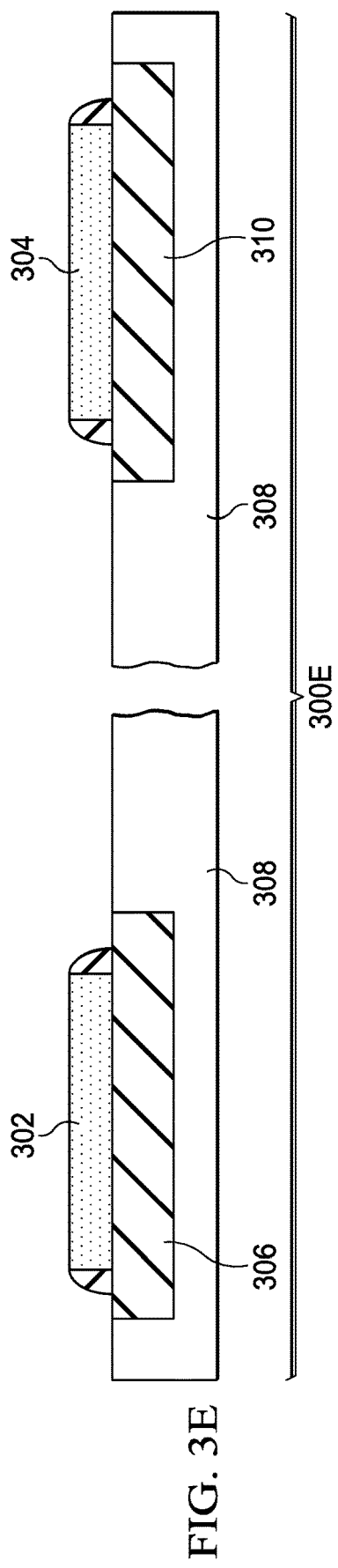

FIG. 3E depicts wafer 300E with polysilicon resistor 302 and polysilicon resistor 304 after the dopants have been dispersed throughout the resistors. As shown in FIG. 3E, the dopants are evenly dispersed through each of the polysilicon resistor 302 and polysilicon resistor 304; however, this is not a requirement. Normally, one would expect that two resistors that received different doses of the dopant(s) as shown in FIG. 3D would have different concentrations of dopants and thus different resistances. However, in one embodiment, resistors in the location of polysilicon resistor 302 have historically received a slightly lower dose than designed due to variability in the process. In this instance, previous inequities in the dosage received by polysilicon resistor 302 and polysilicon resistor 304 may have been reduced by the adjustments, providing similar concentrations to polysilicon resistor 302 and polysilicon resistor 304. If the exposure dose was adjusted because of variations in the width of the polysilicon lines forming polysilicon resistor 302 and polysilicon resistor 304, the two resistors may have somewhat different concentrations of dopant that even out the differences in width and provide similar resistances. The key in reducing the variability of resistance across the wafer is in the use of both a reticle that defines an exposure window for a resistor as having multiple openings and multiple dopant blocking regions and an exposure map that adjusts the exposure dose for each target region according to collected data.

Figure 4A:
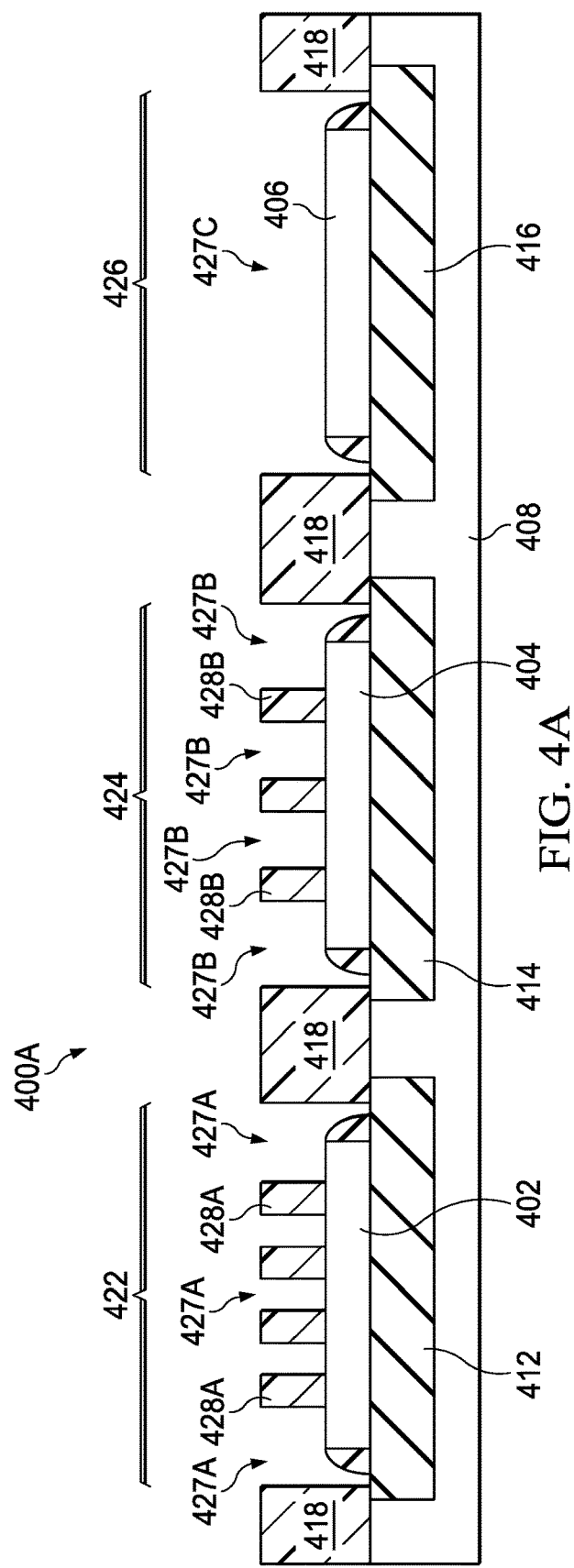

FIGS. 4A-4C are provided to demonstrate how designing the reticle to vary the size of the openings in the exposure window can allow resistors having similar footprints to have resistances that vary significantly. FIG. 4A depicts a wafer 400A on which a first polysilicon resistor 402, a second polysilicon resistor 404, and a third polysilicon resistor 406 are formed. The resistors may be formed in proximity to each other, as shown or may be separated by other structures. First polysilicon resistor 402 has been formed over isolation structure 412 in substrate 408; second polysilicon resistor 404 has been formed over isolation structure 414; and third polysilicon resistor 406 has been formed over isolation structure 416. Additionally, photoresist layer 418 has been deposited and patterned in preparation for implanting dopants into first polysilicon resistor 402, second polysilicon resistor 404 and third polysilicon resistor 406.

Three respective exposure windows have been formed in photoresist layer 418. A first exposure window 422 provides a first plurality of openings 427A, e.g., five, and a first plurality of dopant blocking regions 428A, e.g., four, over first polysilicon resistor 402. A second exposure window 424 provides a second plurality of openings 427B, e.g., four, and a second plurality of dopant blocking regions 428B, e.g., three, over second polysilicon resistor 404 and a third exposure window 426 contains a single opening 427C over third polysilicon resistor 406. In one embodiment, third polysilicon resistor 406 may be a wider resistor than first polysilicon resistor 402 and second polysilicon resistor 404 and not require the same degree of compensation for cross-wafer variations in polysilicon height and linewidth.

FIG. 4B depicts wafer 400B as dopants 401 are implanted into first polysilicon resistor 402, second polysilicon resistor 404 and third polysilicon resistor 406. Dopants 401 may again be boron or any other dopant used to adjust the resistance of the polysilicon resistors. As seen in this figure, third polysilicon resistor 406 receives dopant across the entire resistor, while first polysilicon resistor 402 and second polysilicon resistor 404 each receive dopant in the respective openings of their respective exposure windows. First polysilicon resistor 402 contains four un-doped regions 430A and second polysilicon resistor 404 contains three un-doped regions 430B. Thus, although the regions of first polysilicon resistor 402 and second polysilicon resistor 404 that lie under the openings in their respective exposure windows receive the same concentration of dopant as third polysilicon resistor 406, overall, first polysilicon resistor 402 receives a lower concentration of dopant than second polysilicon resistor 404 and second polysilicon resistor 404 receives a lower concentration of dopant than third polysilicon resistor 406.

FIG. 4C depicts wafer 400C after first polysilicon resistor 402, second polysilicon resistor 404 and third polysilicon resistor 406 have been annealed. Again, the resistors are depicted as having evenly dispersed dopant, although that may or may not be the case in practice. First polysilicon resistor 402 has the lowest concentration of dopant and will thus have the highest resistance of the three resistors; second polysilicon resistor 404 has a higher concentration of dopant and a lower resistance than first polysilicon resistor 402; and third polysilicon resistor 406 has the highest concentration of dopant and therefore the lowest resistance. Accordingly, use of the disclosed method can enhance the ability to provide resistors having the same footprint but different resistances from the same dopant implant. Additionally, while the use of different striping can allow resistors within the same circuit to provide different sheet resistances, the differentiation depicted in FIGS. 4A-4C can be combined with the disclosed exposure map to reduce the variability of each of these resistors across the wafer due to unintentional differences.

Figure 5:
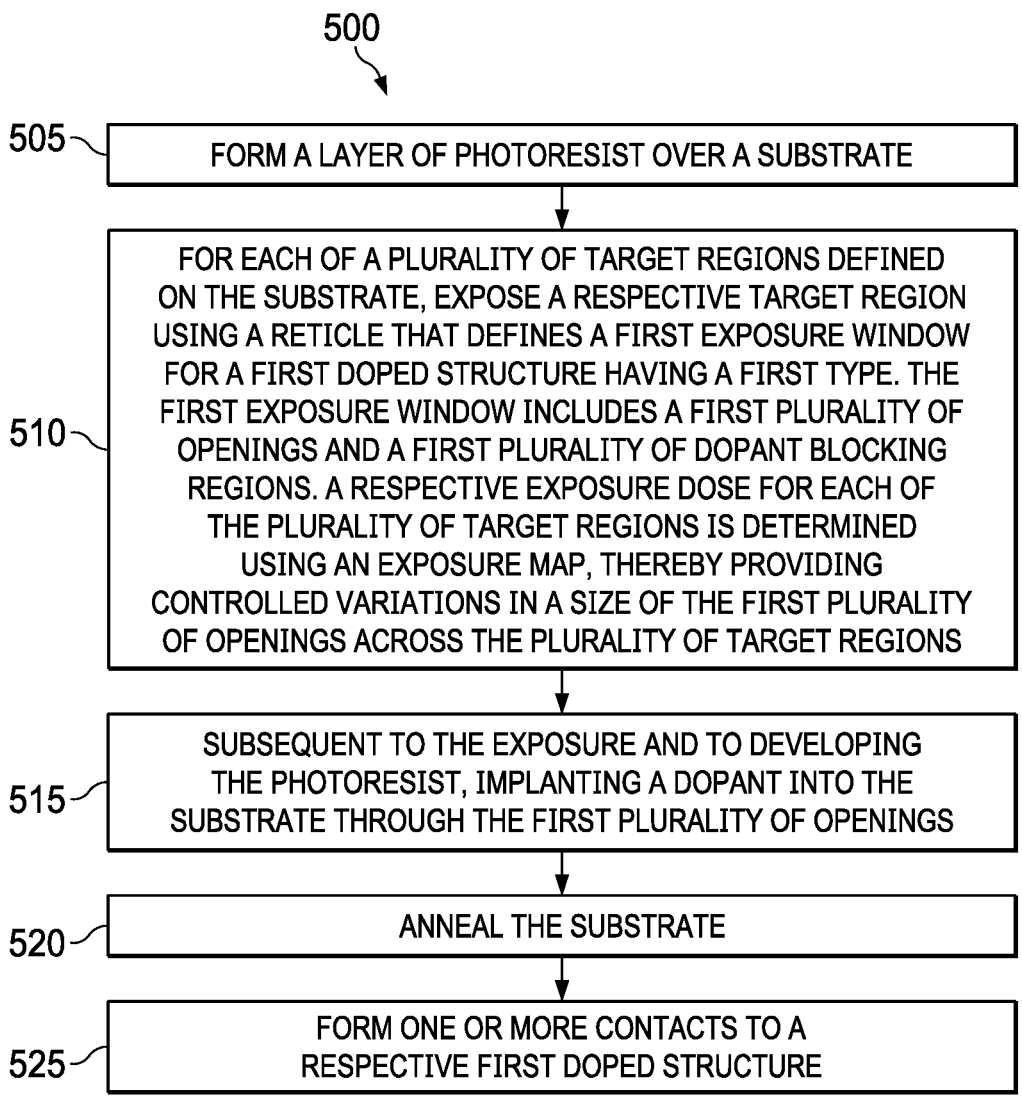
FIG. 5 depicts a method of forming an integrated circuit according to an embodiment of the disclosure.

FIG. 5 depicts a method 500 of fabricating an integrated circuit according to an embodiment of the disclosure. Method 500 begins with forming 505 a layer of photoresist over a substrate. Depending on the structures that are to be doped using the current layer of photoresist, the layer of photoresist may also be formed over, e.g., polysilicon lines for transistor gates and polysilicon resistors. Target regions for exposing a pattern onto the photoresist will have been defined and may be shots, such as are illustrated in FIG. 1 or the exposure dose may be varied across die and across wafer using photo exposure dose mapper. For each of a plurality of target regions defined on the substrate, each respective target region is exposed 510 using a reticle that defines a first exposure window for a first doped structure that has a first type. In one embodiment, the first type is a polysilicon resistor and the first doped structure is polysilicon resistor 402, which has a first exposure window 422. The first exposure window 422 includes a first plurality of openings 427A and a first plurality of dopant blocking regions 428A. A respective exposure dose for each of the plurality of target regions is determined using an exposure map, thereby providing controlled variations in a size of the first plurality of openings across the plurality of target regions.

Subsequent to the exposure and to developing the photoresist, a dopant is implanted 515 into the substrate through the first plurality of openings. Because of the variations in the size of the openings in the respective exposure windows, the amount of dopant that each respective first doped structure receives can thus be adjusted to compensate for differences in resistance that exist across the wafer due to small differences in elements such as the height and width of polysilicon lines and in the deposition and anneal processes. Although only one dopant is specifically mentioned, multiple dopants can be implanted into the doped structure using the same patterned photoresist layer. The substrate is then annealed 520 to cause migration of the dopant through the doped structure, including through un-doped regions lying below the dopant blocking regions. One or more contacts to each respective first doped structure are also formed 525. A polysilicon resistor, for example, will have two contacts.

FIGS. 5A-5E depict various elements of the method that may be optional or varied. For example, FIG. 5A discloses that a pre-amorphization implant can be implanted 530 through the first plurality of openings. This may be done in order to facilitate the migration of dopants into the un-doped regions. FIG. 5B illustrates that the exposure map can be defined 535 using measurements taken on a completed wafer. In one embodiment, these measurements are of sheet resistance taken from an end-of-line cross wafer sheet resistance map. FIG. 5C illustrates that the exposure map can also be defined 540 using measurements taken on a wafer in fabrication. In one embodiment, scatterometry is used to determine variations in the width and thickness of polysilicon lines that will be doped for transistor gates and polysilicon resistors. FIG. 5D illustrates that the reticle can further define 545 a second exposure window for a second doped structure having the first type. In one embodiment the second doped structure is polysilicon resistor 404 and the second exposure window is exposure window 424. The second exposure window 424 includes a second plurality of openings 427B and a second plurality of dopant blocking regions 428B that have a different arrangement from the first plurality of openings and first plurality of dopant blocking regions 428A. FIG. 5E illustrates that the reticle can further define a third exposure window for a third doped structure having the first type. The third exposure window has a single opening. In one embodiment, the third doped structure is polysilicon resistor 406 and the third exposure window is exposure window 424 with a single opening 427C.

Figure 6:
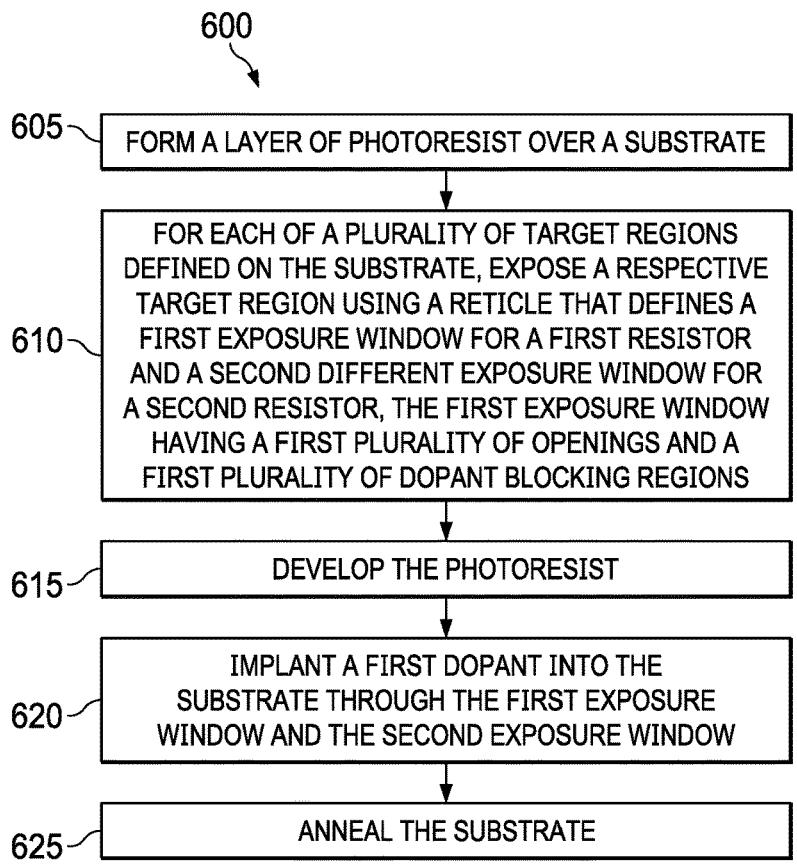
FIG. 6 depicts a method of forming an integrated circuit according to an embodiment of the disclosure.

FIG. 6 depicts a method 600 of fabricating an integrated circuit, specifically one containing a polysilicon resistor. Method 600 again begins with forming 605 a layer of photoresist over a substrate. The layer of photoresist will also be formed over any prospective resistors. For each of a plurality of target regions defined on the substrate, a respective target region is exposed 610 using a reticle that defines a first exposure window for a first resistor and a second different exposure window for a second resistor. The second exposure window may have more openings than the first exposure window or less; the dopant blocking regions may be larger or smaller, as may the openings. Other variations can also be provided. In one embodiment, the first exposure window is exposure window 422 and the first resistor is polysilicon resistor 402. The first exposure window 422 has a first plurality of openings and a first plurality of dopant blocking regions 428A. In one embodiment, the second exposure window can be either exposure window 424 or exposure window 426 and the second resistor can be either polysilicon resistor 404 or polysilicon resistor 406. The photoresist is then developed 615 and is followed by implanting 620 a first dopant into the substrate through the first exposure window and the second exposure window and annealing 625 the substrate.

Figure 6A:
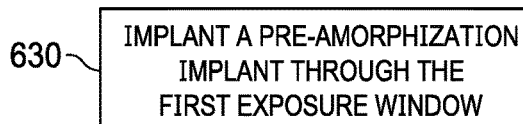
FIGS. 6A-6C depict additional elements that may be part of the method of FIG. 6.
Figure 6B:
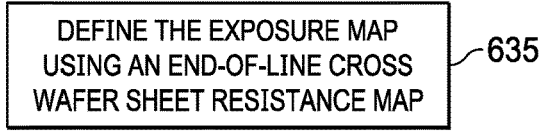
Figure 6C:
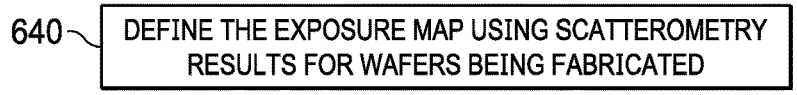

FIGS. 6A-6C again depict various elements of the method that may be optional or varied. FIG. 6A discloses that a pre-amorphization implant can be implanted 630 through the first exposure window in order to facilitate the migration of dopants into the un-doped regions. FIG. 6B illustrates that the exposure map can be defined 635 using an end-of-line cross wafer sheet resistance map. FIG. 6C illustrates that the exposure map can also be defined 640 using scatterometry to determine variations in the polysilicon lines for wafers in the process of being fabricated.

The disclosed methods can be used to allow multiple doped structures such as resistors to be fabricated with different resistances from the same implant and simultaneously to reduce variability between multiple instances of the doped structures across the wafer. Rather than exposing the entire structure for doping, the photoresist is patterned to form dopant blocking regions such as stripes across the length of the structure. The amount of the structure that receives the implanted dopant(s) can be varied between resistors in the same chip using, for example, different widths of stripes. At the same time, each of the target regions containing the structures can receive a customized exposure dosage in order to correct the variations seen across the wafer. Improvements in yield and reductions in testing costs may also be benefits of the procedures.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of fabricating an integrated circuit, the method comprising:

forming a layer of photoresist over a substrate;

for each of a plurality of target regions defined on the substrate, wherein one of the target regions includes at least a portion of the integrated circuit, exposing the photoresist overlying a respective target region using a reticle that defines a first exposure window that exposes an area for a first resistor and a second different exposure window that exposes an area for a second resistor, the first exposure window having a first plurality of openings that expose portions of the area for the first resistor and a first plurality of dopant blocking regions that cover portions of the area for the first resistor, wherein a respective exposure dose for each respective target region is determined by an exposure map, wherein the respective exposure dose for the first exposure window is different from the respective exposure dose for the second different exposure window;

developing the photoresist, forming the first exposure window in the photoresist and forming the second different exposure window in the photoresist;

implanting a first dopant into the area for the first resistor using the first exposure window and into the area for the second resistor using the second different exposure window; and annealing the substrate, wherein the first dopant is activated, forming the first resistor and the second resistor.

2. The method as recited in claim 1 further comprising a first of the plurality of target regions receiving a first exposure dose through the first exposure window and a second of the plurality of target regions receiving a second exposure dose, different than the first exposure dose, through the first exposure window.

3. The method as recited in claim 1 further comprising implanting a pre-amorphization implant into the area for the first resistor using the first exposure window and into the area for the second resistor using the second different exposure window, prior to implanting the first dopant.

4. The method as recited in claim 1 wherein the first plurality of openings and the first plurality of dopant blocking regions form stripes.

5. The method as recited in claim 1 wherein the second different exposure window has a second plurality of openings and a second plurality of dopant blocking regions that have a different arrangement than the first plurality of openings and the first plurality of dopant blocking regions.

6. The method as recited in claim 1 wherein the second different exposure window comprises a single opening.

7. The method as recited in claim 2 further comprising defining the exposure map using an end-of-line cross wafer sheet resistance map.

8. The method as recited in claim 2 further comprising defining the exposure map based on scatterometry measurements taken across a wafer.

9. The method as recited in claim 5, wherein the first plurality of dopant blocking regions includes more dopant blocking regions than the second plurality of dopant blocking regions.

10. The method as recited in claim 5, wherein the second plurality of dopant blocking regions are wider than the first plurality of dopant blocking regions.

11. The method as recited in claim 1 further comprising defining the exposure map using an end-of-line cross wafer sheet resistance map.

12. The method as recited in claim 1 further comprising defining the exposure map based on scatterometry measurements taken across a wafer.

13. A method of fabricating an integrated circuit, the method comprising:

forming a layer of photoresist over a first polysilicon structure and a second polysilicon structure of the integrated circuit, the second polysilicon structure being separate from the first polysilicon structure;

exposing the photoresist using a reticle that defines a first exposure window over the first polysilicon structure and a second different exposure window over the second polysilicon structure, the first exposure window having a first plurality of openings that expose portions of the first polysilicon structure and a first plurality of dopant blocking regions that cover portions of the first polysilicon structure;

developing the photoresist, forming the first exposure window in the photoresist and forming the second different exposure window in the photoresist;

implanting a first dopant into the first polysilicon structure using the first exposure window and into the second polysilicon structure using the second different exposure window; and annealing, wherein the first dopant is activated, forming a first resistor from the first polysilicon structure and a second resistor from the second polysilicon structure.

14. The method as recited in claim 13 further comprising implanting a pre-amorphization implant into the first polysilicon structure using the first exposure window and into the second polysilicon structure using the second different exposure window, prior to implanting the first dopant.

15. The method as recited in claim 13 wherein the first plurality of openings and the first plurality of dopant blocking regions form stripes.

16. The method as recited in claim 13 wherein the second different exposure window has a second plurality of openings and a second plurality of dopant blocking regions that have a different arrangement than the first plurality of openings and the first plurality of dopant blocking regions.

17. The method as recited in claim 16, wherein the first plurality of dopant blocking regions includes more dopant blocking regions than the second plurality of dopant blocking regions.

18. The method as recited in claim 16, wherein the second plurality of dopant blocking regions are wider than the first plurality of dopant blocking regions.

19. The method as recited in claim 13, wherein the second different exposure window comprises a single opening.

20. The method as recited in claim 13, wherein implanting the first dopant into the first polysilicon structure and implanting the first dopant into the second polysilicon structure occur concurrently.

* * * * *